United States Patent [19]

Jones et al.

[11] 4,340,854
[45] Jul. 20, 1982

[54] DISTORTION MEASUREMENT SYSTEM

[76] Inventors: Wayne W. Jones, 100 Francois St., Apt. 613, Nuns' Island, Quebec, Canada, H3E 1E2; Roger Stone, R.R. #1, Stittsville, Ontario, Canada, K0A 3G0

[21] Appl. No.: 139,673

[22] Filed: Apr. 14, 1980

[51] Int. Cl.$^3$ ............................................. G01R 27/00
[52] U.S. Cl. .............................. 324/57 DE; 324/77 R; 328/162; 331/135; 455/67
[58] Field of Search ............. 324/57 DE, 57 N, 77 R; 328/162; 371/63; 455/50, 63, 67, 115, 295, 296; 331/135

[56] References Cited
U.S. PATENT DOCUMENTS

| | | | |
|---|---|---|---|
| 3,571,705 | 3/1971 | Crane et al. | 324/77 R |
| 3,821,648 | 6/1974 | Campbell | 324/57 N |
| 3,890,570 | 6/1975 | Kristensen et al. | 324/77 R |
| 3,978,401 | 8/1976 | Lum | 324/57 N |

Primary Examiner—Stanley T. Krawczewicz
Attorney, Agent, or Firm—Fleit & Jacobson

[57] ABSTRACT

A type of Total-Harmonic-Distortion (THD) distortion analyzer is described in which the use of the State Variable (SV) circuit in both the oscillator and the filter sections confers several benefits and results in performance superior to previously available analyzers. In the SV oscillator, the traditional compromise in the automatic level control function between settling time, component tolerance and distortion is alleviated by the use of polyphase level detection, made possible by the SV circuit. The doubly-integrated output available from the SV circuit also minimizes distortion, especially that contributed by the level-setting AGC. The other property of the SV circuit, which is particularly valuable, is the connection of frequency-setting elements to virtual-ground points, which allows great simplification of wide-range tuning circuitry. Exploitation of this property is described both for manual and programmable cases. The SV circuit is also superior to many previously employed circuits in its tolerance of component inaccuracies. The simultaneous presence of high-pass, band-pass and low-pass outputs from the SV filter is shown to be advantageous also for its use as the filter on a distortion analyzer.

16 Claims, 9 Drawing Figures

LOW DISTORTION OSCILLATOR

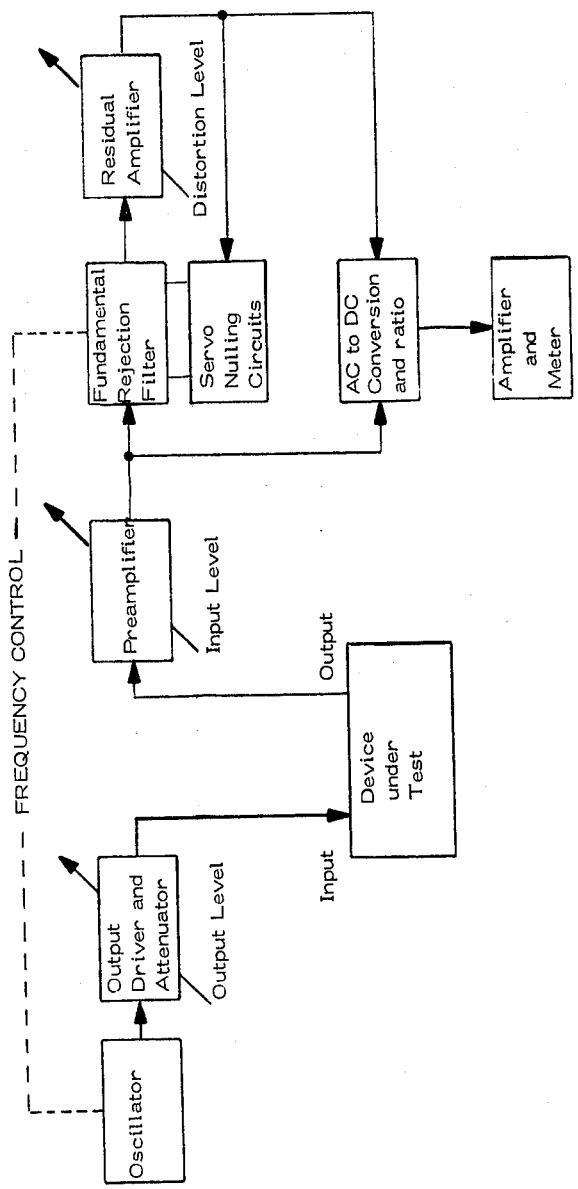
FIG 1 BLOCK DIAGRAM OF A TYPICAL DISTORTION ANALYSER

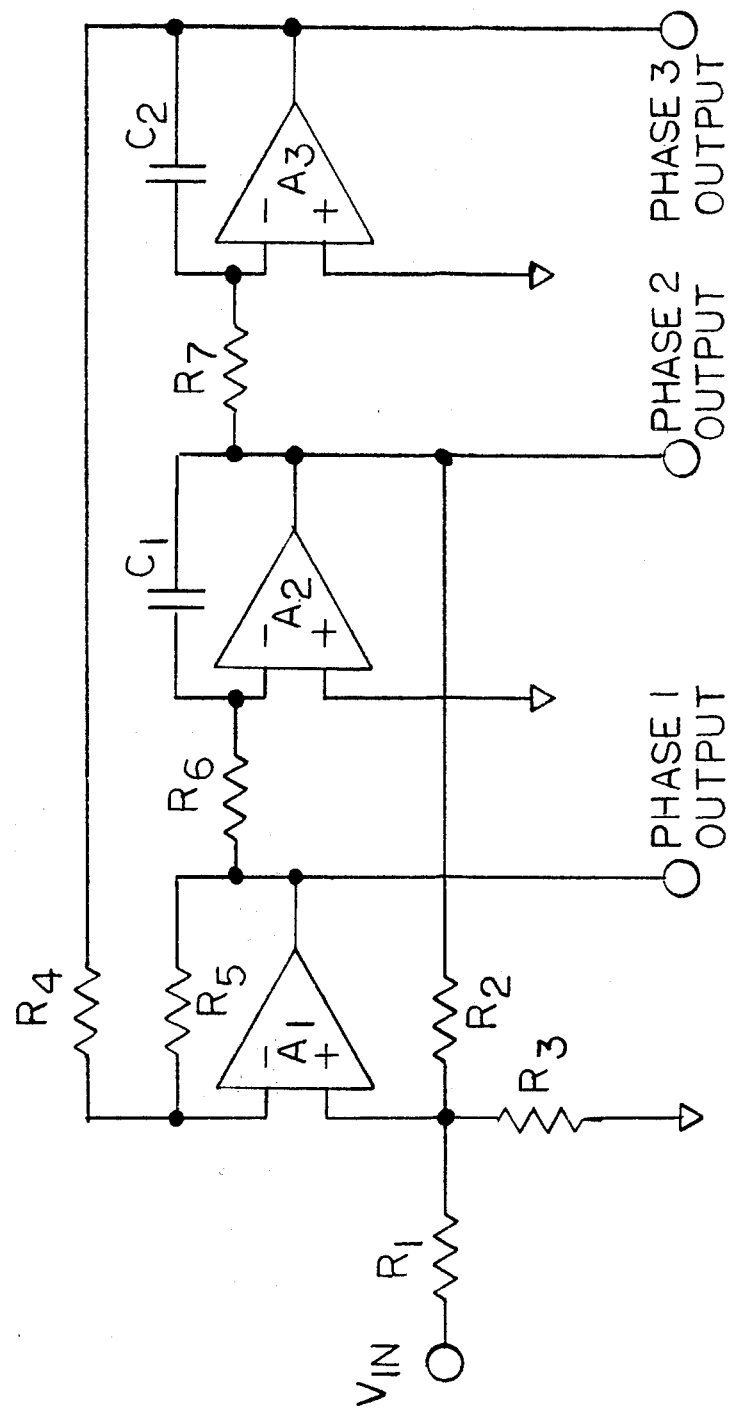
FIG 2  STATE VARIABLE CIRCUIT

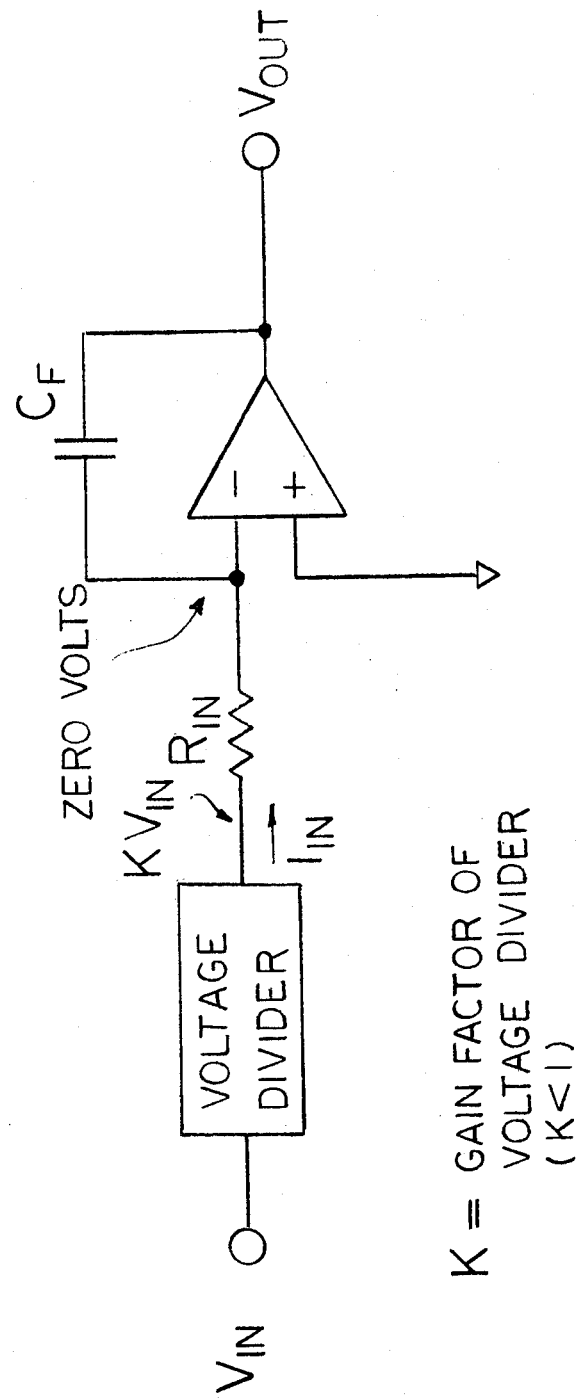
FIG 3  VARIABLE INTEGRATOR USING A VOLTAGE DIVIDER

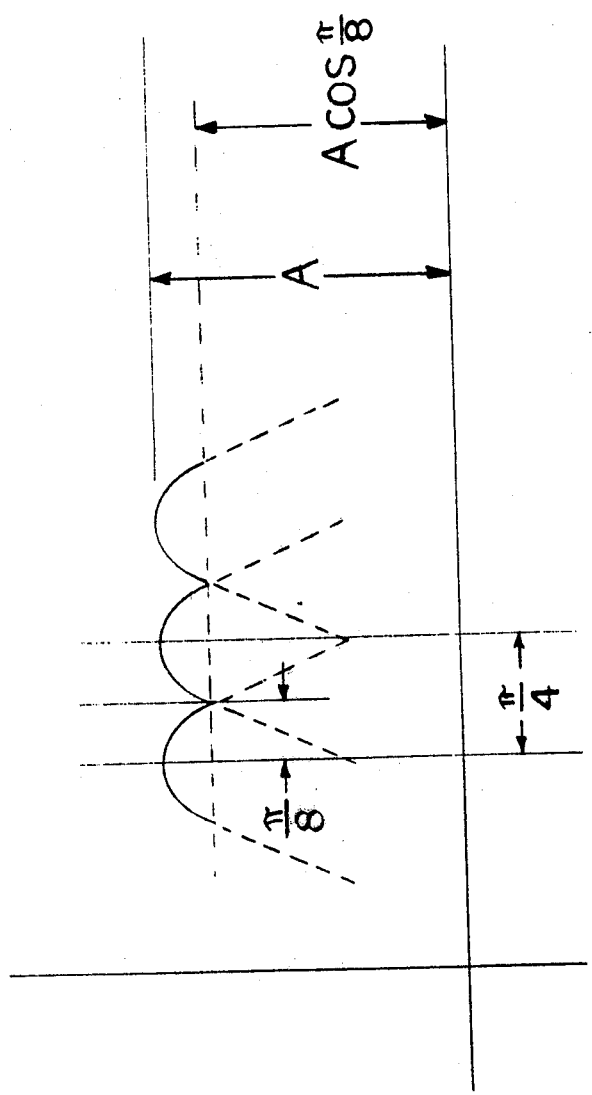
FIG 4 POLYPHASE RECTIFICATION

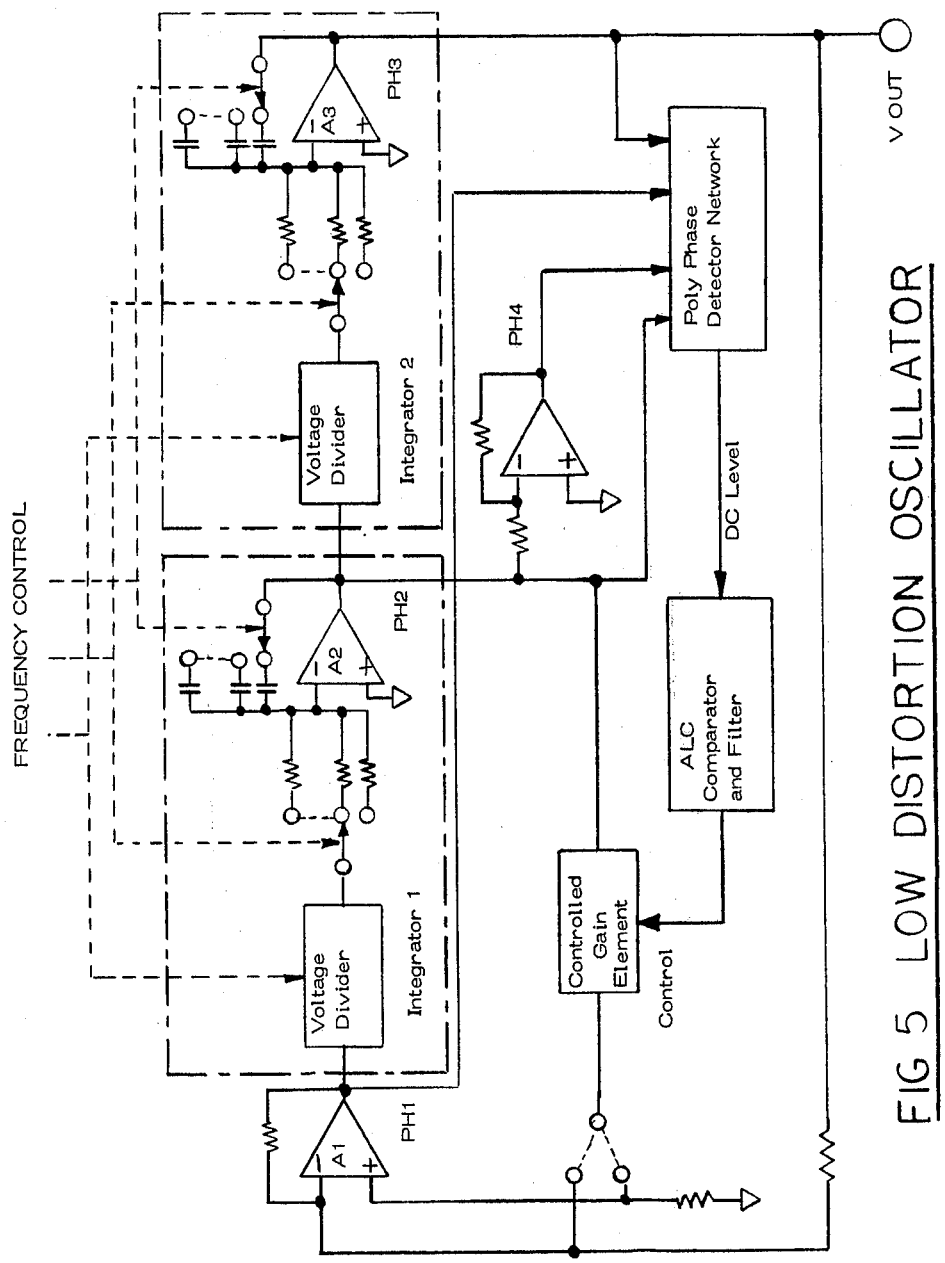
FIG 5 LOW DISTORTION OSCILLATOR

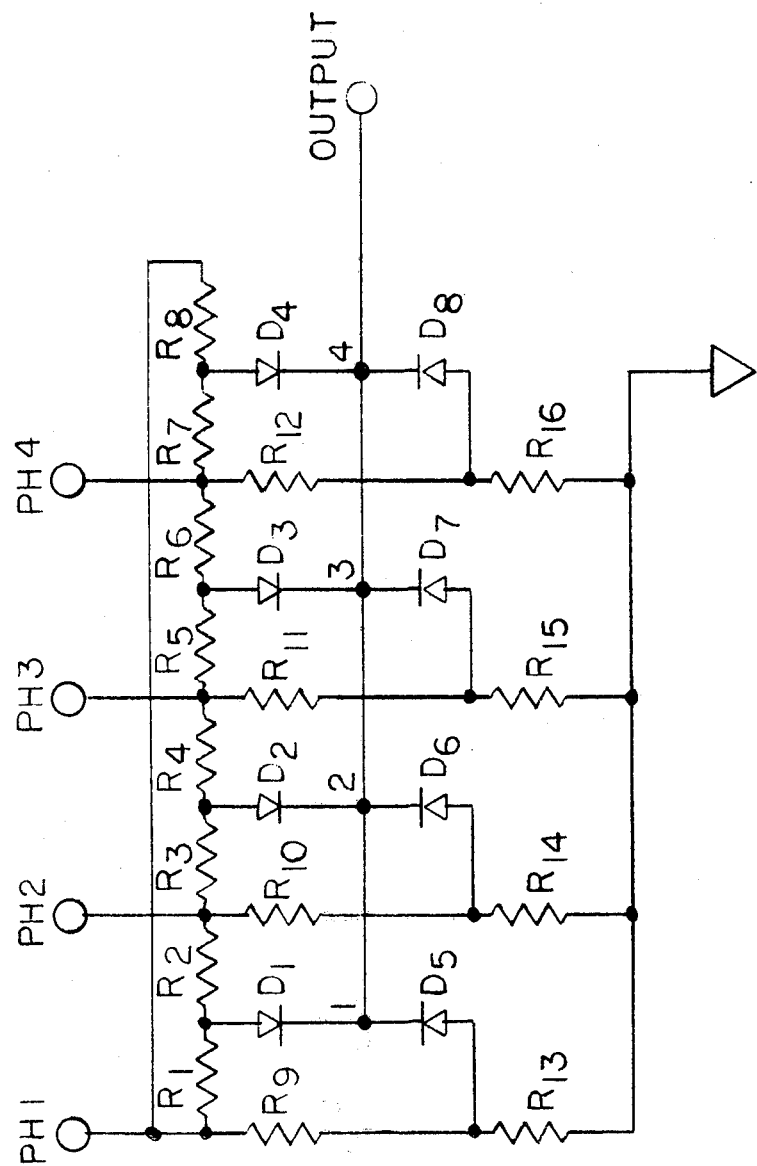
FIG 6 POLYPHASE DETECTOR NETWORK

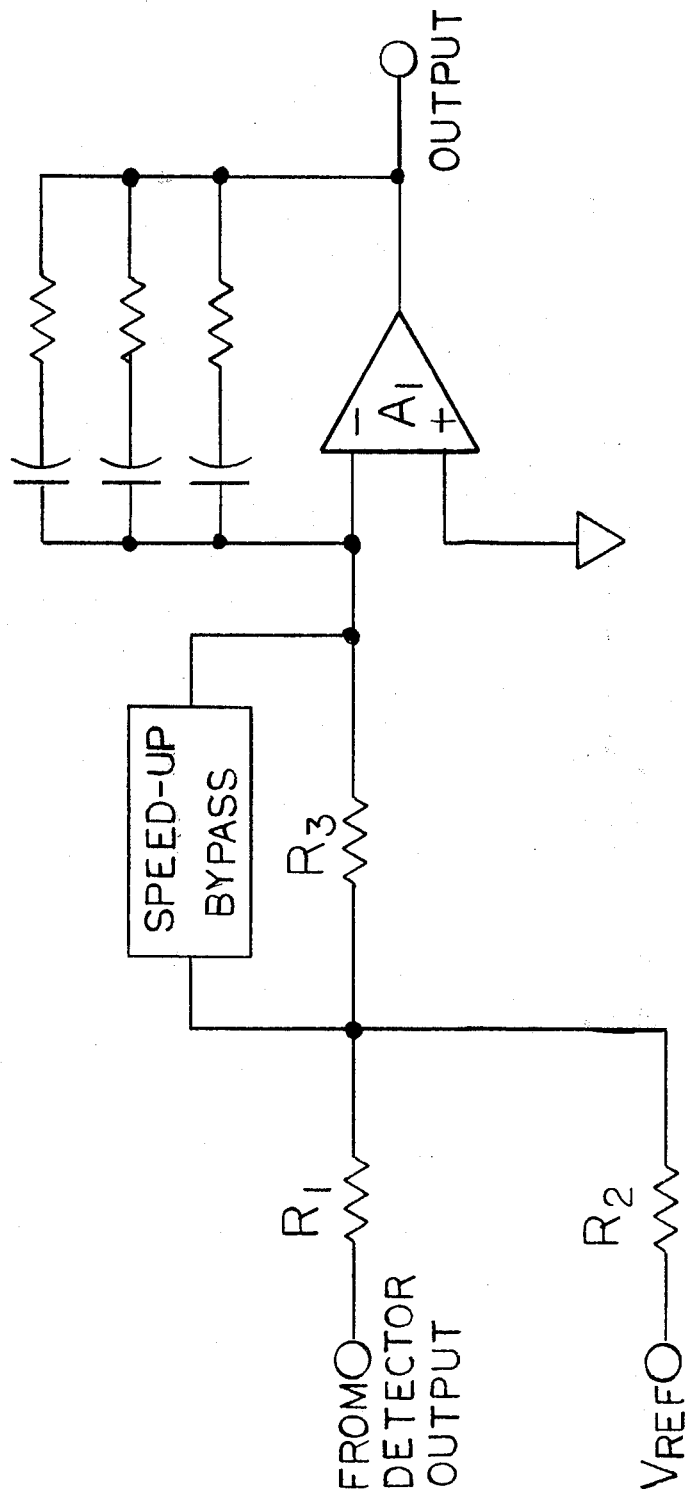
FIG 7 ALC COMPARATOR AND FILTER

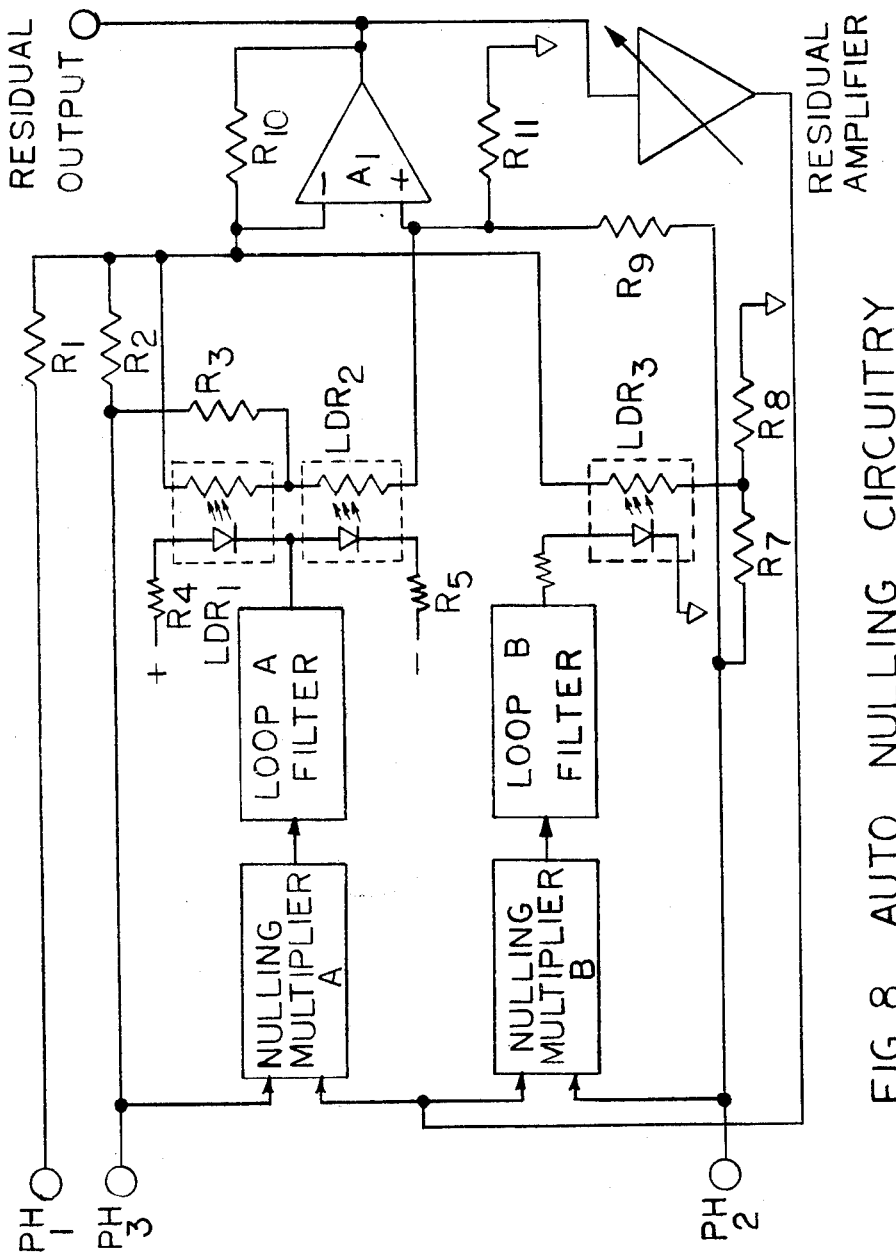
FIG 8 AUTO NULLING CIRCUITRY

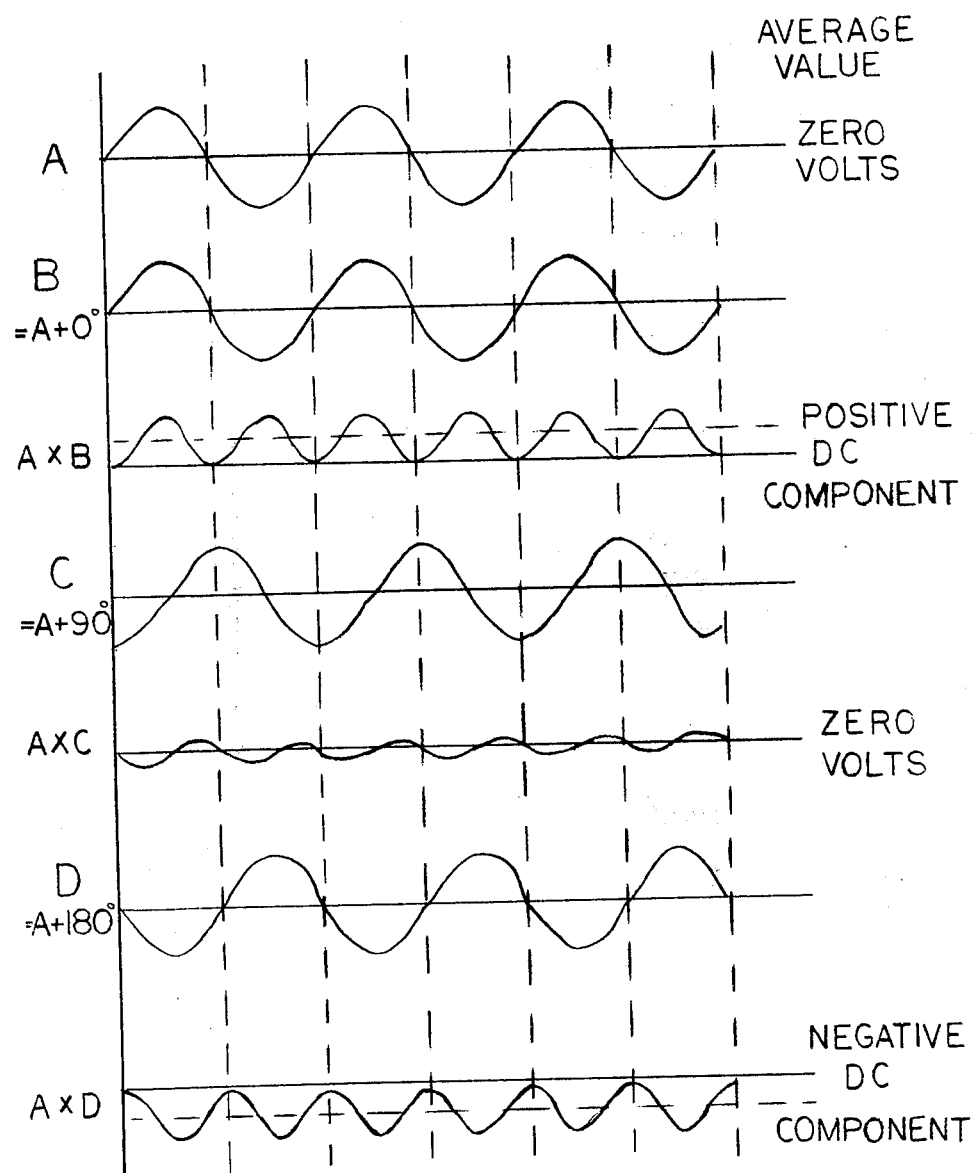
FIG 9 PRODUCTS OF SINEWAVES

DISTORTION MEASUREMENT SYSTEM

BACKGROUND OF INVENTION (a) Field of the Invention

The present invention is directed in general to an audio distortion measurement system and more particularly to a system which includes an ultra low distortion oscillator which may also provide for improved amplitude control, includes a distortion analyzer which has an improved notch filter system, and includes a combination of such analyzer and oscillator forming the overall system where all system components effectively track together and provide for fast stabilization.

(b) Description of Prior Art

In audio distortion measurement systems such as shown, for example, in U.S. Pat. Nos. 3,890,570 and 3,978,401, which may find use in measuring the distortion of audio amplifiers, for example, it is desired to measure distortion to below −95 dB. Moreover, it is desired to make several measurements using various frequencies and signal levels to fully qualify the device under test. The system must provide convenient and rapid means for changing these parameters and rapidly yielding a measured result. In some applications, automatic selection of a sequence of frequency and signal level parameters must be made using an external computer or other control.

Furthermore, the ability of such a system to measure distortion quantities to below −95 dB requires that the oscillator generating the test signal and the analyzer measuring the received test signal have inherent or contributed distortion substantially below this figure.

Prior art has produced systems meeting this performance capability but not the rapid manual parameter selection or external programmable parameter selection. Conversely, prior art exhibits programmable systems yielding computer control capability but not meeting the performance criterion.

A typical prior art distortion analyzer is produced by Sound Technology Inc., Campbell, Calif., as model 1700B or 1701A. Various features of this system are shown in the above-mentioned U.S. Pat. No. 3,978,401 in the name of Jack G. S. Lum assigned to Sound Technology, Inc. In general, all distortion analyzers known to the Applicants operate on the principle of selectively rejecting a fundamental frequency component and then measuring the remaining components which, of course, make up the distortion of the main waveform.

In general, a classic problem in the design of a low distortion oscillator and distortion analyzer is that both components of the distortion measurement system must be varied over a wide frequency range and signal level range in order to perform the necessary function of the system in measuring the distortion of signals of various frequencies and levels, for example, over the audio range. To change frequencies requires the changing of resistive-capacitive components. This introduces component variations because of the tolerances and mistracking of such components. In order to compensate for such variations feedback adjustments are necessary. However, such feedback adjustments in turn introduce distortion thus defeating the entire purpose of providing a distortion measurement system.

Prior devices have attempted to meet the foregoing problems but have only partially done so. Most important no prior system can effectively measure in a simple and economical manner the low distortion which are now included in the specifications of modern receiver-amplifiers. No prior system lends itself to external parameter control or rapid manual control.

OBJECTS OF THE INVENTION

It is, therefore, an object of the present invention to provide an improved distortion measurement system.

It is another object of the invention to provide such a system which includes improved oscillator and analyzer sections.

It is a further object of the invention to provide such a system which does not require passive components of relatively high tolerances.

It is another object of the invention to provide such a system as above which is simple to operate and relatively high speed in operation.

A further object of the present invention is to accomplish the foregoing in a manner which permits the operating frequency of the instrument to be varied either by means of linear, semi-precision potentiometers for a manually-tuned implementation or by means of digitally-switched attenuators in an electronically-tuned implementation.

SUMMARY OF INVENTION

The above-listed objectives are satisfied by means of an instrument consisting of two state variable (SV) filter circuits, one of which is provided with automatically-controlled positive feedback to form an oscillator, required in cases when the instrument must provide the signal drive for the measurement. The SV circuit which is used as a filter is equipped with a summing amplifier which gives band-reject or "notch" response, and with automatic servo circuits which trim the element values in that summing amplifier to eliminate or "null" the fundamental frequency from the waveform under scrutiny, leaving only the harmonics which have been introduced by the distortion of the device under test (DUT).

The tuning frequency of the oscillator and of the filter are nominally the same.

In accordance with a specific embodiment, a distortion measurement system for measuring distortion of a signal passed through a device under test which device includes input means and output means, said signal comprising a fundamental frequency and remaining frequencies; said system comprising: fundamental frequency rejection filter means, having input means and output means, for rejecting said fundamental frequency but for passing said remaining frequencies of said signal, said rejection filter means comprising a state variable circuit connected as a filter, the output means of said device under test being connected to the input means of said rejection filter means; and means for comparing the amplitude of a signal at the input of the filter means to the amplitude of a corresponding signal at the output thereof for determining distortion of said device.

In accordance with a further specific embodiment, an oscillator circuit including: a state variable circuit comprising a plurality of outputs, the output signals at said outputs being phase shifted relative to one another, said state variable circuit further comprising input means; detector means for detecting the amplitude of the output of said state variable circuit; comparator means for comparing said detected amplitude with a DC reference level and for generating an error signal proportional to the difference between said detected amplitude and said DC reference level; and automatic gain control means for adjusting the gain of said oscillator to minimize said error signal.

BRIEF DESCRIPTION OF DRAWINGS

The invention will be better understood by an examination of the following disclosure together with the accompanying drawings in which:

FIG. 1 is a block diagram of a typical distortion analyzer system;

FIG. 2 illustrates a state variable circuit used in the fundamental rejection frequency filter and in the oscillator circuit of the distortion analyzer system;

FIG. 3 illustrates a variable integrator using a voltage divider useful for explaining the operation of the state variable circuit as modified in the present invention;

FIG. 4 is a graph illustrating polyphase rectification of a polyphase detector network as illustrated in FIGS. 5 and 6;

FIG. 5 is a block diagram of a low distortion oscillator in accordance with the invention;

FIG. 6 illustrates a polyphase detector network used in the oscillator of the present invention;

FIG. 7 illustrates an example of an automatic level control comparator and filter used in the oscillator of the present invention;

FIG. 8 illustrates an embodiment of an automatic nulling circuitry used in the fundamental rejection frequency filter; and FIG. 9 is a series of graphs useful in explaining the operation of the automatic nulling circuitry.

DESCRIPTION OF PREFERRED EMBODIMENTS

THEORY

In preparation for the detailed description of the invention in the next section, this section presents two bodies of background or reference material:

(1) General theory of operation of THD analyzers (2) Description of the State Variable Filter and of its particular advantages for use in distortion analyzers.

This allows the description of the invention to be presented in the most concise form.

1 GENERAL THEORY OF OPERATION OF THD ANALYZERS

The normal method of measuring the Total Harmonic Distortion (THD) of a signal consists of rejecting the fundamental-frequency component of the signal and measuring the amplitude of the remainder. The THD is then derived as:

$$THD = \frac{\text{amplitude of remainder}}{\text{amplitude of original signal}}$$

Strictly speaking the "remainder" which is measured should consist of harmonics only, excluding noise. However this would require a variable-frequency comb filter or similar provision, which would be very expensive and is not provided either in previous THD analyzers nor in those under discussion here.

To analyze down to −100 dB (0.001%) distortion requires a rejection of the fundamental component which is in excess of that figure, to avoid incurring errors. This cannot reasonably be provided by simple filtering, using fixed or manually variable components. Some form of automatic nulling circuitry is required, which monitors the presence of fundamental in the "residual" signal (the output of the fundamental-rejection filter) and controls elements of the filter to "null out" or remove this fundamental component. All currently used THD analyzers, and those discussed in this patent, operate in this way.

FIG. 1 is the block diagram of a typical THD analyzer. An oscillator drives the unit under test via an output driver and attenuator which set the appropriate signal level; or, the signal to be analyzed may originate externally.

In either case the distortion analyzer provides an input preamplifier to normalize the amplitude of the incoming signal to a range of levels required for operation of succeeding circuitry.

The fundamental-rejection filter performs the function described previously, of removing the fundamental-frequency component of the signal to a very complete degree, by the use of servo (automatic) circuits driven from amplified residual signal. It is set nominally to the signal frequency in one of two ways:

(a) If the instrument is providing the signal to drive the unit under test, the fundamental rejection filter receives its frequency setting from the same control as the oscillator.

(b) If the signal originates elsewhere, means are provided of manually or automatically setting the fundamental-rejection filter to approximately the correct frequency. In the manual case this is usually done by illuminating one of two "turn signals" which prompt the operator to turn the control thus tuning the filter upwards or downwards.

Finally, the amplified residual signal and the normalized "full" signal are rectified (converted from AC to DC) and their ratio taken, or vice versa in some instruments, and the result presented to some form of readout, e.g. a meter.

The portions of such a distortion analyzer which present the most difficult design problems are the oscillator and the fundamental-rejection filter. It is these functions which are addressed in this patent.

The oscillator presents two main problems:

(a) How to provide frequency tuning over a wide (1000:1 or more) range with minimum waveform distortion and complexity of either the circuit or the operation of the instrument.

(b) How to stabilize the amplitude of oscillation at all frequencies without incurring waveform distortion or long settling times.

The design of the filter presents the following problems:

(a) As for oscillator (tuning)

(b) How to perform the servo nulling with minimum induced distortion, circuit complexity, and time lag.

2 THE STATE VARIABLE FILTER AND OSCILLATOR CIRCUITS

The design of the main Filter and Oscillator Circuits in accordance with the invention is based upon the well-known "State Variable" filter circuit, and exploits several unique properties of this configuration.

A State Variable (SV) filter in its simplest form is shown in FIG. 2.

Amplifiers A1, A2 and A3 are operational amplifiers.

Amplifier A1 is connected as a differential amplifier and amplifiers A2 and A3 are connected as integrators. Feedback via R2 and R4 to the differential amplifier A1 gives filter-type responses from the various outputs to inputs via R1. These are:

| From Amplifier | Name | Filter Response Type |
| --- | --- | --- |
| A1 | Phase 1 (Ph 1) | High pass |
| A2 | Ph2 | Band pass |
| A3 | Ph3 | Low pass |

By the use of extra feedback paths (positive feedback not shown in FIG. 2) the filter can be made into an oscillator. Automatic gain control can be applied in order to stabilize the amplitude of oscillation without clipping. By the use of an AGC element capable of four-quadrant operation, the SV circuit can be configured in a degenerate form where R1 and R2 are open-circuit, R3 shorted.

The SV configuration has been well documented as having certain advantages for general applications. However, it has specific advantages for use as the filter and the oscillator in a distortion analyzer. These are listed and discussed below.

2.1 EASE OF FREQUENCY CONTROL

The tuning frequency (center of bandpass or band-reject response for a filter; frequency of oscillation for an oscillator) is set by the values of R6, C1, R7 and C2. Usually R6 and R7 are equal; C1 and C2 are equal. Now, R6 and R7 feed into nodes which are nominally at ground potential. This renders the control of the equivalent values of R6 and R7 much easier than if both ends of each resistor carried AC voltage as in other oscillator or filter circuits (e.g. Wien Bridge). For, each can be replaced by a voltage divider followed by a resistor. As the attenuation of the voltage divider is increased, the equivalent value of the integrator input resistor increases since a lower proportion of the input voltage appears at the "hot" end of the fixed resistor, hence less current flows into the integrator. FIG. 3 illustrates this. Here $$R\ equiv = \frac{Vin}{Iin}$$

$$= \frac{Vin}{KVin/R}$$

$$= \frac{R}{K}$$

The importance of this is that it is much simpler to make a manually or electronically controllable divider having well-defined attenuation (K) and low distortion, than it is to produce a manually or electronically controllable value of resistance or capacitance, having similar properties. Such circuits are described later.

Heretofore, distortion analyzers have achieved frequency tuning by the use of arrays of precision resistors and capacitors which are switched by decade knobs. These are expensive to produce. They are also inconvenient to use, since the user often must manipulate several switches to set a desired frequency or to tune the instrument to an unknown frequency. For example, in going from 5.9 kHz to 6.1 kHz one knob must be rotated from 5 to 6, the other from 9 to 1. Not only is this inconvenient, but the temporary mistuning generates transient voltages in the internal stabilizing circuits of the instrument which cause delays in obtaining final readings. Thus, a circuit which allows most tuning to be done with a potentiometer (i.e. a single knob) confers great advantage, for a manually operated analyzer.

In practice, limitations of operational amplifiers and of available resistor and capacitor types require that the value of the actual input resistor and feedback capacitor be switched in order to cover a very wide frequency ratio. However, such switching can be restricted to simple forms such as the "decade ranging" (10 Hz–100 Hz, 100 Hz–1 kHz, 1 kHz–10 kHz, 10 kHz–100 kHz) which is almost universally employed on all sorts of instruments and is not objectionable. Or, in to the case of a digitally controlled frequency, the two or three most significant bits of the code can be used to select physical resistors and capacitors, the remainder dealing only with attenuation.

2.1.0 FORMS OF FREQUENCY-CONTROL ATTENUATOR 2.1.1 MANUAL CASE

To implement a manually-controlled THD analyzer, the variable dividers can be implemented as front panel knob-controlled potentiometers. Potentiometers of sufficient precision for use in a THD analyzer are generally available (or affordable) only in linear form, i.e. in which the resistance is proportional to angle of rotation. This form is suitable for use as a true potentiometer, (i.e. voltage divider, or attenuator) where one end is grounded and the wiper feeds a resistive load to a ground potential. It is very unsuitable for a rheostat or variable resistor as its use would result in a highly non-linear calibration scale with most of the range crammed at one end.

2.1.2 DIGITALLY-CONTROLLED CASE

A digitally-controllable SV filter or oscillator can be implemented using resistive voltage dividers with tap points selected by analog multiplexer IC's driven by the digital frequency-select code. Additional switching to select one of a few input resistors or feedback capacitors (Rin, Cf of FIG. 3) gives wide range of control. The addition of a multiplying digital-to-analog converter controlling a fraction of the signal extends the resolution down to very fine steps in frequency.

The variation of frequency with control code can readily be made logarithmic by such an arrangement, merely by the proper choice of R and C values. That is, an increment in the control code always increments the frequency by a certain PERCENTAGE, not by a certain number of HERTZ. This is most appropriate for audiooriented instrumentation. (The statement is not strictly true of the multiplying D/A converter, which is linear, but this device covers only a few percent in range and within that span the departure from logarithmic behaviour is unimportant).

2.2 POLYPHASE OUTPUTS

At the frequency of tuning, the outputs PH1, PH2 and PH3 have the same amplitude but different phases. PH2 leads PH1 by 90 degrees, and PH3 leads PH2 by 90 degrees (inverse of PH1). This property is exploited in the stabilization of the oscillator and in the servo nulling required for THD measurement, both described below.

2.3 INSENSITIVITY TO COMPONENT INACCURACIES AND TO DEPARTURES FROM IDEALITY IN AMPLIFIERS

The SV circuit is superior to most others in its lack of sensitivity to inaccuracy in component values, or to non-ideal amplifiers. A simple compensation adjustment eliminates "Q-enhancement" due to bandwidth limitations in amplifiers, over the required operating frequency range (100 kHz is a standard and very adequate upper limit for distortion analyzer operation).

2.4 ATTENUATION OF HARMONICS FROM OSCILLATOR AGC

Whatever form of automatic gain control is employed to stabilize the amplitude of an oscillator, it will be based upon a device which is usually non-linear (voltage-controlled resistor, analog multiplier, etc) and so will inevitably contribute distortion to the oscillator waveform. In the present case, however, AGC is applied at the summing amplifier, A1 in FIG. 2. If the low-distortion output is taken from PH3 the intervening double integration attenuates harmonics relative to the fundamental component by the square of the harmonic number: $\times 4$ for the second harmonic, $\times 9$ for third harmonic, etc.

2.5 EIGHT-PHASE RECTIFICATION FOR OSCILLATOR STABILIZATION

In order to stabilize the amplitude of a sinusoidal oscillator, the gain controlling element mentioned above must receive a control signal proportional to the difference between the oscillator amplitude and the desired value of that amplitude (or "set point" in control system parlance). This requires that the oscillator amplitude be derived as a DC voltage from the sinusoidal waveforms in the oscillator, which is usually done by rectification followed by low-pass filtering. The usual difficulties encountered here are:

(a) The ripple voltage from the filter gets amplified by the difference amplifier which compares amplitude to set point. This modulates the sinewave passing through the AGC element (multiplier or other device) producing distortion.

(b) The phase lag of the low-pass filter leads to considerable difficulty in stabilizing the loop against "hunting" or oscillation of the envelope of the sinusoid (which is intended to be flat).

The oscillator is already an infinite Q filter, which is an integrator in the "envelope" sense (a step change in inputs sinusoid amplitude would produce a ramp change in output sinusoid amplitude, in the absence of correction by the AGC). This integration term followed by a low-pass filter presents a particularly difficult control stability problem, to make it operable over a very wide frequency range.

The traditional approach to oscillator stabilization has been to use a very long time-constant in the low-pass filter following rectification, and suffer the long settling times and marginal stability resulting from this. These last features are unacceptable in an automatic distortion analyzer, or a manual one intended for rapid operation.

There are methods for deriving a D.C. voltage proportional to the amplitude of a sinusoid, without producing large ripple outputs. One is to synchronously sample-and-hold the waveform, i.e. to sample it repeatedly at a fixed electrical angle. This introduces significant complexity and the risk of seeing spikes on the output of the oscillator.

The oscillator circuit depicted in FIG. 5 exploits the polyphase outputs of the state variable filter. By inverting PH2 we obtain a total of our waveforms, evenly spaced in phase: relative to PH1, the succeeding ones differ by $\pi/2$, $\pi$ and $3\pi/2$ radians' phase. The outputs PH1, PH2, PH3 and PH4 are fed to a polyphase detector network shown in FIG. 6.

In the resistor network at the top half of FIG. 6, dividers connected between the phases produce waveforms having phases halfway between, i.e. at $\pi/4$, $3\pi/4$, $5\pi/4$ and $7\pi/4$ relative to PH1. The amplitude of these sinusoids is reduced by a factor of $\sqrt{2}$ from that of the first set of four sinusoids. The dividers to ground from PH1, PH2, PH3 and PH4 in that network give versions of those waveforms attenuated by the same factor. The result is a set of eight sinusoids (points 1 to 8) of the same amplitude and frequency, having phases spaced evenly around a $2\pi$ cycle. Rectifying these with a set of eight matched diodes (available as an integrated circuit, shown) gives a waveform having DC level proportional to the oscillator's amplitude and a very small value of ripple, even before filtering. The peak-to-peak value of the ripple is found by noting that the low point in the waveform occurs when one of the eight phases is equal to its neighbor. (See FIG. 4).

The proportion of ripple is:

$$\frac{A - A \cos \frac{\pi}{8}}{A} = 0.076 = 7.6\%$$

This is a very small value, and its fundamental frequency is eight times the oscillator frequency, hence readily attenuated by a filter having a low cut-off rate such as the "semi-integrator" used. This filter (A1 of FIG. 7 and associated components) approximates an attenuation rate of 3 dB per octave (vs 6 dB for an integrator) and a constant phase shift of 45 degrees. The latter allows adequate phase margin for loop stability in the presence of the effective 90 degrees phase shift inherent in the "envelope" integration discussed previously. The filter amplifier is also the difference amplifier for amplitude correction.

The above-described method for oscillator stabilization exploits the polyphase outputs of the state variable filter. Another method (previously published) also does this. Two multipliers are used, to produce the square (second power) of the waveforms PH2 and PH3 (or PH1 and PH2). Since these waveforms differ by $\pi$, the trigonometric identity $\sin^2 \theta + \cos^2 \theta = 1$ applies, and if the multiplier outputs are summed the result is a DC voltage proportional to oscillator amplitude and containing theoretically no ripple at all. The drawbacks to this circuit relative to the eight-phase passive rectifier previously described are:

(a) Multipliers capable of suitable performance are fairly expensive. They require setting-up potentiometers, and procedures for adjusting them, to achieve that performance. This further raises production costs and reduces reliability. (Note that these objections are not applicable to multipliers used for oscillator AGC, since its gain and offsets are not nearly so critical as those of the matched pair needed here.)

(b) Any errors in the amplitude balance between the phases, caused by tolerance errors in the frequency determining components in the SV filter/oscillator, will be doubled by the multipliers. Additional errors can arise due to instability of multiplier constants.

As above-mentioned, this method for oscillator stabilization exploits the polyphase outputs of the state variable filter. It will, of course, be appreciated that the state variable filter can be used in an oscillator circuit without exploiting the polyphase outputs thereof. Thus, any one of the outputs of the state variable circuit (PH1, PH2 or PH3) could be the output of the oscillator. The same output would be used as a reference level to the Controlled Gain Element shown in FIG. 5. Preferably, if a single phase is to be used, the output would be the PH3, and, as mentioned, this would constitute both the output of the oscillator as well as the reference level.

2.6 GAIN ELEMENT DISTORTION CONTRIBUTION

In a typical low distortion oscillator, the greatest distortion contributor is the amplitude control element used to maintain the positive feedback to just produce oscillation. Available control elements all have inherent distortion exceeding that of the signal amplifiers in the system. As this element is in the signal path, its effects will be visible in the final output. Prior devices have used a Field Effect Transistor as a voltage variable resistor. As the drain-source resistance is relatively non-linear, efforts are made to reduce its contribution within the circuit. Some methods include the use of relays to gradually adjust the amount of contribution effected by this device as the oscillator approaches an amplitude stable condition. However, any disturbance to the circuit, such as that caused by frequency selection, requires a relatively slow sequence of events to restabilize to a constant amplitude, low distortion state.

The present invention uses an inherently lower distortion gain control element. Furthermore, the phase inversions and availability of variations in input polarity provided by the SV circuit yields a convenient method to minimize the gain element contribution. The circuit is significantly faster responding and reaches a final value much faster than prior switched schemes. In the stable condition, the gain control element is at a minimum contribution condition. It can provide a positive or negative correction, as required, to correct the amplitude loop. Furthermore, it can do so on a smooth, linear, rapid fashion as opposed to the stepwise, slow method used in prior instruments.

2.7 DISTORTION CANCELLATION

The distortion introduced by gain control elements can be generally grouped into two categories. The non-linearity of the device itself generally produces third order harmonics. These are minimized by the techniques described in 2.6 above. A second type of distortion is produced by control signal modulation. The control signal will always contain some finite amount of ripple no matter how effective the filtering is. This ripple contains components of the fundamental signal and modulates the feedback signal to produce second order distortion.

This invention is unique in that several phases of the primary signal are available. By mixing controlled quantities of these signals into the control input, a large percentage of the second harmonic distortion can be cancelled.

The present invention provides four "distortion trim" adjustments which permit the introduction of out of phase and quadrature signals to effectively cancel the presence of second harmonic distortion on the final oscillator output. Two controls are frequency independent and two controls affect only the high frequency components. One set is the inverse phase and the other set the quadrature.

This distortion reduction capability is unique to the configuration employed in the present invention.

2.8 SERVO NULLING FOR THD MEASUREMENT

Referring to FIG. 8, to achieve the very high rejection of fundamental frequency required for measurement of Total Harmonic Distortion (THD), PH1 and PH3 are first summed to give a nominal reject characteristic. The effective value of the summing resistor R3 of PH3 is adjusted by an electronic servo to give a very high degree of nulling. However, there remains signal in phase with PH2 (or inverted) which appears in the nulling amplifier output due to inevitable errors in the circuitry: integrators not perfect, stray capacitive coupling, etc. These are nulled by another similar servo driven by PH2. The two nulling servos operate independently (and can be trimmed independently with very little interaction) because of the orthogonality of PH1/PH3 versus PH2. Also the whole operation is performed independently of the oscillator trimming function. Thus the polyphase outputs of the SV filter are exploited again.

2.9 FAST-RESPONDING TUNING INDICATORS

An important feature which is made possible by the independence of the nulling circuit and by the polyphase outputs from the SV filter is the use of very simple, independent circuits for indication of correct tuning. As mentioned previously, a THD analyzer must be tuned to the frequency of the incoming signal, sufficiently closely to be within range of the nulling servo circuits. Heretofore, tuning indication has commonly been derived from the nulling servo circuits themselves. However, the unavoidable time-lags in the loop filters cause delays in the reaction of the indicators. This makes tuning difficult for the manual user who must wait for true tuning indication, or risk overshooting if tuning is done too rapidly. Similar problems exist in automatic instruments.

The SV filter provides two output signals which exhibit respectively high-pass and low-pass characteristics. Comparison of the signal amplitudes appearing at these points indicates whether the filter is tuned high or low. When the filter is tuned too high, the low-pass output exceeds the high-pass output, and conversely.

This allows very simple circuitry to detect and indicate a tuning error at a speed which appears instantaneous to the human user. This considerable advantage would not be available if the SV filter did not provide simultaneous high-pass and low-pass outputs, or if it were automatically tuned to frequency as the means of arriving at the nulled condition, so that the ratio of amplitudes at the high-pass and low-pass outputs for fixed frequency was variable by the action of the servo loops.

2.10 AVAILABILITY OF A BANDPASS OUTPUT

The band-pass output, ("phase 2"), of the SV filter is available without added circuit complexity or configurational switching. This allows the distortion analyzer to be used as a tuned voltmeter for measurement of such variables as crosstalk, noise spectrum, etc. Other rejection filters do not provide this feature.

DESCRIPTION OF THE INVENTION

The invention consists of two parts:

(a) A low distortion oscillator using a state variable filter with special means of automatic stabilization of amplitude.

(b) A low-distortion filter, with servo nulling circuitry, for rejection of the fundamental frequency of a periodic waveform; also the means of informing an operator whether that filter is tuned too high or too low for the nulling circuit to operate.

1 LOW DISTORTION OSCILLATOR

The low distortion oscillator is depicted in FIG. 5 and consists of a state variable (SV) filter with feedback applied to cause oscillation at the frequency of tuning, and with automatic level control (ALC) to set the level of oscillation. The ALC consists of a polyphase detector network which converts the signal amplitude in the SV circuit to a DC level; an ALC comparator and filter which compares that DC level to a reference and applies low-pass filtering to the result; and a controlled-gain element which controls the amount of signal feedback applied, to sustain oscillation at a fixed amplitude.

Frequency control is applied in common to the corresponding voltage dividers or switches of both integrators. Voltage dividers may be knob-controlled, ganged potentiometers for a manually-operated distortion analyzer; or electronically-switched resistive dividers for a digitally-controlled distortion analyzer. The particular advantage of the SV filter in regard to these attenuators is explained above.

An example of the polyphase detector network is shown in FIG. 6. A preliminary description of this function was given above. The signals PH1, PH2, PH3 and PH4 are sinusoids of equal amplitude, differing each from the next by 90 degrees in phase.

Resistors R1 through R8 are all of equal value. R9 through R12 are of equal value, and R13 through R16 are of equal value. Thus there are three resistance values involved. One may be chosen at will, and the other two chosen to give equal amplitudes and output impedance levels presented to all of the diode anodes. This results in the eight-phase rectified waveform, described above, which contains only a very small proportion of ripple.

An example of the ALC comparator and filter function is shown in FIG. 7. The operational amplifier is configured as a modified integrator. In steady-state conditions, no sustained current flows into or out of the op amp summing junction, which requires that the DC potential at the junction of R1 and R2 be zero.

The resistor R3 is large, to attenuate ripple from the detector output. To provide rapid settling of the ALC loop and consequent stabilization of the oscillator waveform, a means may be employed by bypass R3. This "speed-up bypass" may take the form of voltage-breakover devices (e.g. zeners or diodes) which pass extra current as a result of sufficient net departure from zero of the potential at the R1-R2 junction. Or, it may consist of parallel resistors switched in by external control.

The controlled-gain element can be any device which accepts an AC signal and a DC control input, and outputs a proportion of the former according to the value of the latter. Its reaction time of dynamic response to a changing control input must be adequately fast, and its signal bandwidth must extend beyond 100 kHz. Its signal distortion must be minimal. Such devices as voltage-controlled attenuators and analog multipliers can be used. The latter has the advantage of four-quadrant capability, so that the signal through it can be nominally zero, varying in either phase from that point as required to stabilize oscillation. The output of the controlled-gain element is fed to the positive or negative input of amplifier A1 as required.

2 FILTER AND SERVO NULLING CIRCUIT

The filter is the same circuit as FIG. 5, deleting the functions of the ALC loop: polyphase detector, ALC comparator and filter, and controlled-gain element. Frequency control is identical. Signal may be fed in via a resistor to either the positive or the negative input of A1.

An embodiment of the auto-nulling circuit is shown in FIG. 8.

3 SERVO NULLING TO REJECT FUNDAMENTAL

Referring to FIG. 8, to obtain a band-reject or "notch" response output from a state-variable filter, the high-pass output (referred to here as Phase 1 or PH1) is summed with the low-pass output (Phase 3 or PH3). The two are nominally 180 degrees different in phase, and summing them results in a notched response with the null at the tuning frequency of the filter, where their amplitudes are equal. Thus in FIG. 8, all elements would be deleted except R1, R2, R10 and A1. R11 would be shorted.

Due to component tolerances and the fact that the filter may only be tuned within a few percent of signal frequency, it is necessary to trim the ratio of the summing resistors. This is done in the same way that one would do it by hand; observe the output of the reject filter and trim the resistor ratio to remove the fundamental.

If the integrators in the filter exhibited exactly 90 degrees of phase shift and if there were no stray capacitive coupling in the circuit, the above procedure would probably suffice. In practice these conditions do not obtain, so that it is necessary also to null out the fundamental in the "quadrature" phase, i.e. PH2 which is at 90 degrees to PH1 and PH3. This nulling is performed in the same way as for PH1 and PH3.

Thus we have two similar nulling servo circuits. Because they operate upon signal components which are at 90 degrees to each other they are independent of each other, even though they operate on a common signal.

A nulling servo functions as follows. The output of the Reject Summing Amplifier A1 is passed through the Residual Amplifier. The output of this circuit is within a few dB of the maximum tolerable level. It is fed to one input of a multiplier, the other being the sinewave PH3 which represents the component to be removed from the reject output.

The multiplier may be thought of as a "mixer" in the radio rather than the audio sense. For each component in the residual waveform, multiplication by the fundamental-frequency waveform PH3 produces a "sum" and a "difference" component. In the case of a residual component at the same frequency as PH3 (and ONLY in this case) the difference component in the multiplier output has zero frequency, i.e. it is DC. By low-pass filtering the multiplier output, we can extract this DC component and use it to drive one or more electronically variable resistors which set up the reject summing circuit to null out the fundamental-frequency component in the residual waveform. Thus the servo loop is closed.

FIG. 9 is intended to give a better understanding of this process. It shows the results of multiplying a sinusoid with successively phase-shifted versions of itself. At every point in time, the value of the "product" waveform is proportional to the product of the values of the two original waveforms, as the reader can readily verify. It can be seen that multiplying by a quadrature (90 degrees phase shifted) waveform produces a zero DC component; multiplying by the inverse (180 degrees phase shifted) waveform produces a negative DC component. The "sum" component in all cases is at twice the fundamental frequency, and is removed by subsequent low-pass filtering.

All signal components in the residual which are not at the fundamental frequency produce sum and difference frequencies which are not zero, hence are removed by low-pass filtering or integration.

In FIG. 8, signal current in R3 is diverted preferentially into the positive or negative input of A1 according to the relative resistances of the two LED/light-dependent resistors LDR1 AND LDR2. This allows the servo loop to null out fundamental components either in phase with PH1 or in phase with PH3. The resistance of LDR1 increases and that of LDR2 decreases as the output of the LOOP A filter is driven higher drawing more current in R5 and less in R4; and conversely for decreasing potential out of the LOOP A filter. The symmetrical operation described allows auto-nulling to take place over the maximum possible range of frequencies, for a given level of distortion from the LDR's.

The amount of correction required from LOOP B is very much smaller, and a single LDR is employed. A fixed resistor R9 feeds some PH2 signal to the positive input of A1, while LDR3 contributes to the negative side. Thus, either polarity of correction can be provided.

We claim:

1. A distortion measurement system for measuring distortion of a signal passed through a device under test, said device comprising input means for receiving said signal and output means for providing said signal as an output, said signal comprising a fundamental frequency and remaining frequencies;

said system further comprising:

fundamental frequency rejection filter means having an input for receiving said signal provided by said device, and for rejecting said fundamental frequency and for passing said remaining frequencies of said signal, said fundamental frequency rejection filter means comprising a state variable circuit connected as a filter, the output means of said device under test being connected to the input of said fundamental frequency rejection filter means, said fundamental frequency rejection filter means having an output; and comparing means for comparing the amplitude of a signal at the input of the fundamental frequency rejection filter means to the amplitude of a corresponding signal at the output thereof for determining distortion of said device.

2. A system as defined in claim 1, further comprising a residual amplifier for amplifying said remaining frequencies of said signal and having an input and an output, said input of said residual amplifier being connected to said output of said fundamental frequency rejection filter means.

3. A system as defined in claim 2, further comprising an automatic nulling circuit receiving an input both from the output of said residual amplifier and from the output of said fundamental frequency rejection filter means, said automatic nulling circuit being provided to achieve high rejection of said fundamental frequency.

4. A system as defined in claim 3, wherein said comparing means comprises means for providing a ratio equal to the amplitude of said remaining frequencies to the signal input at the input of said fundamental frequency rejection filter means, said means for providing a ratio having a first input connected to the input of said fundamental frequency rejection filter means, and a second input connected to the output of said residual amplifier.

5. A system as defined in claim 4, wherein said state variable circuit comprises three operational amplifiers, each said operational amplifier having an output;

a first one of said operational amplifiers being connected as a differential amplifier;

a second one and a third one of said operational amplifiers being connected as integrators;

the three operational amplifiers being connected in electrical series such that said first operational amplifier is at the input of said fundamental frequency rejection filter means; and the outputs of said operational amplifiers comprising signals phase-shifted relative to one another.

6. A system as defined in claim 5, wherein each said operational amplifier comprises a positive input terminal and a negative input terminal, said system further comprising:

a first resistor connected in circuit between the output terminal of said first operational amplifier and the negative input terminal of said first operational amplifier;

a first capacitor connected in circuit between the output terminal of said second operational amplifier and the negative input terminal of said second operational amplifier; and a second capacitor connected in circuit between the output terminal of said third operational amplifier and the negative input terminal of said third operational amplifier;

a second resistor connected in circuit between the output terminal of said first operational amplifier and the negative input terminal of said second operational amplifier;

a third resistor connected between the output terminal of said second operational amplifier and the negative input terminal of said third operational amplifier;

a fourth resistor connected between the output terminal of said third operational amplifier and the negative input terminal of said first operational amplifier; and a fifth resistor connected between the output terminal of said second operational amplifier and the positive input terminal of said first operational amplifier;

said positive input terminal of said first operational amplifier comprising the input terminal of said fundamental frequency rejection filter means.

7. A system as defined in claim 6, wherein said second and third resistors comprise ganged switched resistive dividers; and wherein said first and second capacitors comprise ganged switched capacitors;

whereby to control the rejection frequency of said fundamental frequency rejection filter means.

8. A system as defined in claim 7, wherein said automatic nulling circuit has a first nulling loop and a second nulling loop, each nulling loop having a first input, a second input and an output;

the output of said third operational amplifier being fed to the first input of said first nulling loop;

the output of said second operational amplifier being fed to the first input of said second nulling loop; and the output of said residual amplifier being fed to the second inputs of said first and second nulling loops, respectively.

9. A system as defined in claim 8, wherein said automatic nulling circuit further includes a summing amplifier having a positive input, a negative input and an output;

said system further comprising summing means for summing the output of said first operational amplifier and the output of said third operational amplifier to obtain a sum, said sum being fed to the negative input of said summing amplifier;

the outputs of said first nulling loop and said second nulling loop being fed to the positive input of said summing amplifier; and the output of said summing amplifier being fed to the input of said residual amplifier.

10. A system as defined in any one of claims 1 or 9, further including an oscillator;

said oscillator means including a state variable circuit connected as an oscillator;

said oscillator and said fundamental frequency rejection filter means being arranged for ganged tuning;

the output of said oscillator being fed to the input means of said device under test.

11. A system as defined in claim 10, said state variable circuit comprising a plurality of outputs for providing output signals, the output signals at said outputs of said state variable circuit being phase-shifted relative to one another, said state variable circuit further comprising an input;

said system further comprising:

detector means for detecting the amplitudes of the output signals of said state variable circuit;

comparator means for comparing said detected amplitude with a DC reference level, and for generating an error signal proportional to the difference between said detected amplitude and said DC reference level; and automatic gain control means responsive to said error signal for adjusting the gain of said oscillator to minimize said error signal.

12. A system as defined in claim 11, wherein said detector means comprises a multi-phase detector network having a plurality of inputs equal to the plurality of outputs of said state variable circuit, each output of said state variable circuit being connected to a respective one of said inputs of said multi-phase detector network, and said multi-phase detector network having an output;

the output of said multi-phase detector network being fed to the input of said state variable circuit to provide automatic gain control of said oscillator circuit.

13. A system as defined in claim 12, wherein said comparator means comprises an automatic level control circuit, said automatic level control circuit being connected in electrical series between the output of said multi-phase detector network and the input of said state variable circuit.

14. A system as defined in claim 13, wherein the output of said second operational amplifier is 90° phase-shifted with respect to the output of said first operational amplifier, and the output of said third operational amplifier is 90° phase-shifted with respect to the output of said second operational amplifier; whereby the output of said third operational amplifier is 180° phase-shifted with respect to the output of said first operational amplifier;

inverter means for inverting the phase of the output of said second operational amplifier, said inverter means having an output;

said plurality of inputs of said multi-phase detector network comprising four inputs;

the outputs of said first operational amplifier, said second operational amplifier, said third operational amplifier, and said inverter means each being fed to a respective one of said inputs of said multi-phase detector network.

15. A system as defined in claim 14, wherein said multi-phase detector network comprises a first input connected to the output of said first operational amplifier, a second input connected to the output of said second operational amplifier, a third input connected to the output of said third operational amplifier, and a fourth input connected to the output of said inverter means;

said system further comprising:

first and second resistors connected in series between said first and said second inputs of said multi-phase detector network;

third and fourth resistors connected in series between sad second and said third inputs of said multi-phase detector network;

fifth and sixth resistors connected in series between said third and said fourth inputs of said multi-phase detector network;

seventh and eighth resistors connected in series between said fourth and said first inputs of said multi-phase detector network;

ninth and tenth resistors connected in series between said first input of said multi-phase detector network and a ground terminal;

eleventh and twelfth resistors connected in series between said second input of said multi-phase detector network and said ground terminal;

thirteenth and fourteenth resistors connected in series between said third input of said multi-phase detector network and said ground terminal;

fifteenth and sixteenth resistors connected in series between said fourth input of said multi-phase detector network and said ground terminal;

first and second diodes connected in series between the junction of said first resistor and said second resistor, and the junction of said ninth resistor and said tenth resistor;

third and fourth diodes connected in series between the junction of said third resistor and said fourth resistor, and the junction of said eleventh resistor and said twelfth resistor;

fifth and sixth diodes connected in series between the junction of said fifth resistor and said sixth resistor, and the junction of said thirteenth resistor and said fourteenth resistor; and seventh and eighth diodes connected in series between the junction of said seventh resistor and the junction of said eighth resistor, and the junction of said fifteenth resistor and said sixteenth resistor;

the junction of said first and second diodes being connected to the junction of said third and fourth diodes, and to the junction of said fifth and sixth diodes, and to the junction of said seventh and eighth diodes, and to the output of said multi-phase detector network.

16. A system as defined in claim 7 wherein:

said ganged switched resistive dividers of said second and third resistors of said fundamental rejection frequency filter means are ganged with the ganged switched resistive dividers of said second and third resistors of said system;

whereby the fundamental rejection frequency of said fundamental rejection frequency filter means and the frequency of operation of said oscillator are controlled in synchronism.

* * * * *